United States Patent [19]
Kayama

[11] Patent Number: 5,241,204
[45] Date of Patent: Aug. 31, 1993

[54] SEMICONDUCTOR MEMORY

[75] Inventor: Shigeki Kayama, Kanagawa, Japan

[73] Assignee: Sony Corporation, Tokyo, Japan

[21] Appl. No.: 925,306

[22] Filed: Aug. 4, 1992

Related U.S. Application Data

[63] Continuation of Ser. No. 733,163, Jul. 19, 1991, abandoned.

[30] Foreign Application Priority Data

Jul. 25, 1990 [JP] Japan .................. 2-196822

[51] Int. Cl.$^5$ .................... H01L 27/01; H01L 27/02; H01L 29/04; G11C 11/34
[52] U.S. Cl. .................. 257/368; 257/381; 257/401; 257/903; 365/182
[58] Field of Search .................. 357/23.7, 41, 59; 365/182; 257/368, 401, 381, 903

[56] References Cited

U.S. PATENT DOCUMENTS

| | | | |
|---|---|---|---|
| 4,794,561 | 12/1988 | Hsu | 365/182 |
| 5,001,539 | 3/1991 | Inoue et al. | 357/23.7 |
| 5,115,289 | 5/1992 | Hisamoto et al. | 357/23.7 |

Primary Examiner—Mark V. Prenty
Attorney, Agent, or Firm—Hill, Steadman & Simpson

[57] ABSTRACT

The invention provides a semiconductor memory which is minimized in leak current and has a high data holding performance. The semiconductor memory comprises a memory cell including a flip-flop in which a thin film transistor is employed as a load element. The thin film transistor has a channel region which is bent at an intermediate portion thereof.

3 Claims, 3 Drawing Sheets

SEMICONDUCTOR MEMORY

This is a continuation of U.S. application Ser. No. 733,163, filed Jul. 19, 1991 and now abandoned.

BACKGROUND OF THE INVENTION

1. Field of the Invention

This invention relates to a semiconductor memory of the type called layer-built CMOS type SRAM.

2. Description of the Prior Art

A complete CMOS type SRAM includes a large number of memory cells each of which has such a construction as shown FIG. 2. Referring to FIG. 2, the memory cell is composed of a flip-flop composed of a pair of N-channel MOS transistors 11 and 12 for driving and a pair of P-channel MOS transistors 13 and 14 for a load, and a pair of N-channel MOS transistors 15 and 16 for transfer.

A grounding line 21 is connected to source regions of the N-channel MOS transistors 11 and 13 while power source lines 22 and 23 are connected to source regions of the P-channel MOS transistors 13 and 14, respectively. Meanwhile, a word line 24 serves as gate electrodes of the N-channel MOS transistors 15 and 16, and bit lines 25 and 26 are connected to either ones of source/drain regions of the N-channel MOS transistors 15 and 16, respectively.

As a type of such complete CMOS type SRAM, there is a layer-built CMOS type SRAM wherein the P-channel MOS transistors 13 and 14 are each formed from a thin film transistor and the thin film transistors are layered on the N-channel MOS transistors 11 and 12.

FIG. 3 shows such P-channel MOS transistors 13 and 14 in a layer-built CMOS type SRAM which is disclosed in Japanese Patent Application No. 1-91519 filed by the applicant of the present application.

In the layer-built CMOS type SRAM, gate electrodes of the P-channel MOS transistors 13 and 14 are formed from polycrystal Si films 31 and 32 in an upper layer on the N-channel MOS transistors 11 and 12, and active regions of and the power source lines 22 and 23 for the P-channel MOS transistors 13 and 14 are formed from polycrystal Si films 33 and 34 in a further upper layer.

Accordingly, an overlapping portion of the polycrystal Si film 33 with the polycrystal Si film 31 forms a channel region of the P-channel MOS transistor 13 while an overlapping portion of the polycrystal film 34 with the polycrystal Si film 32 forms a channel region of the P-channel MOS transistor 14.

It is to be noted that drain regions of the P-channel MOS transistors 13 and 14 of the polycrystal Si films 33 and 34 are connected to the polycrystal Si films 32 and 31 by way of contact holes 33a and 34a, respectively.

In the layer-built CMOS type SRAM described above, however, each of the channel regions of the P-channel MOS transistors 13 and 14 have a linear profile. Consequently, where the area of the memory cell is maintained, the channel length of the P-channel MOS transistors 13 and 14 cannot be made longer than the that of the present memory cell.

Accordingly, with the layer-built CMOS type SRAM described above, it is difficult to decrease leak currents, that is, currents upon waiting, of the P-channel MOS transistors 13 and 14 to obtain a high data holding characteristic.

SUMMARY OF THE INVENTION

It is an object of the present invention to provide a semiconductor memory which is minimized in leak current and has a high data holding performance.

In order to attain the object, according to the present invention, there is provided a semiconductor memory which comprises a memory cell including a flip-flop in which a thin film transistor is employed as a load element, the thin film transistor having a channel region which is bent at an intermediate portion thereof.

With the semiconductor memory, since the channel region is bent at the intermediate portion thereof, the length of the channel region of the thin film transistor can be made longer with a same memory cell area comparing with an alternative case wherein such channel region has a linear profile. Consequently, a leak current, that is, a current upon waiting, can be decreased and a high data holding performance can be assured.

The above and other objects, features and advantages of the present invention will become apparent from the following description and the appended claims, taken in conjunction with the accompanying drawings in which like parts or elements are denoted by like reference characters.

DETAILED DESCRIPTION OF THE PREFERRED EMBODIMENT

Figure 1:
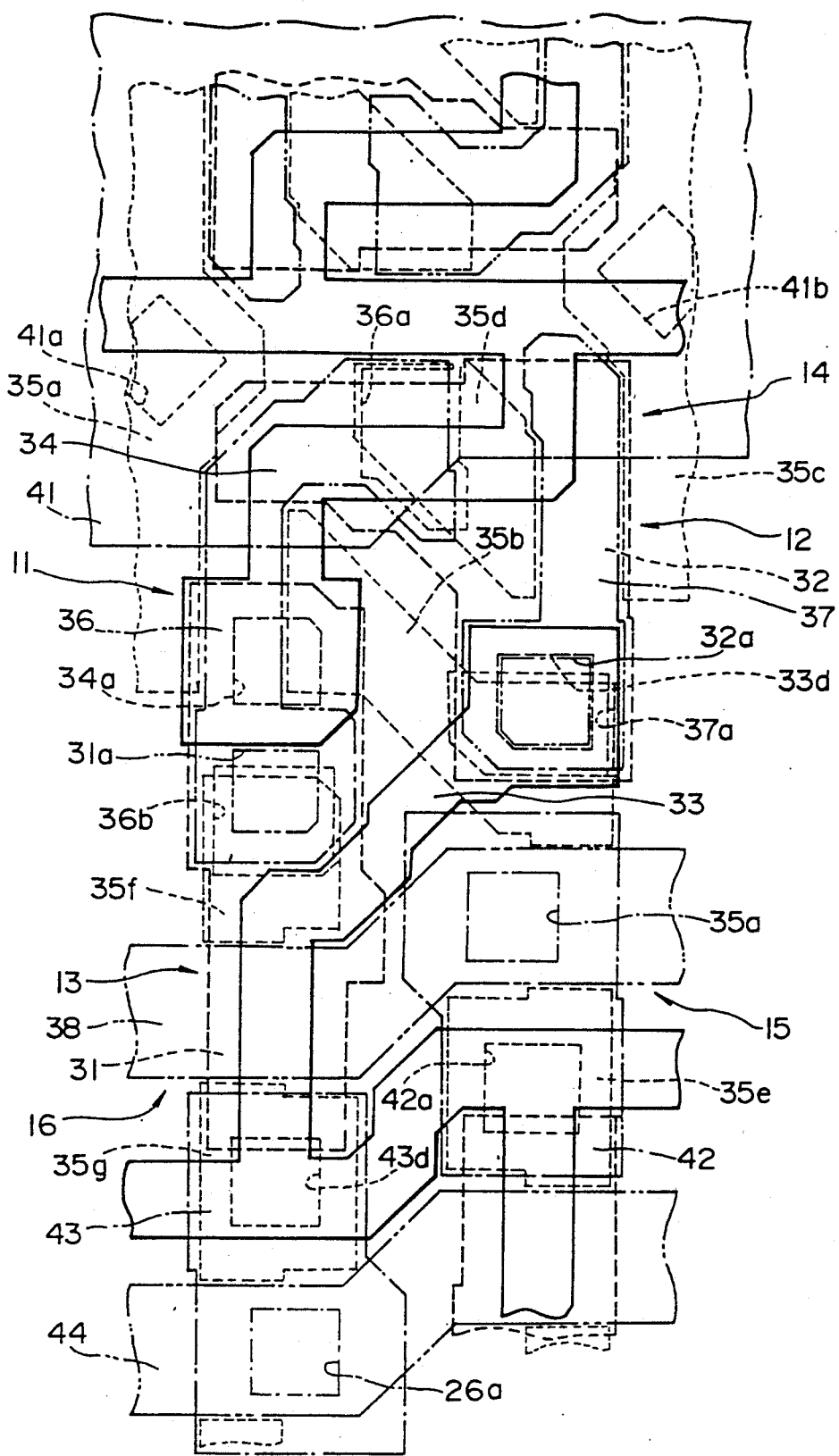
FIG. 1 is a partial plan view of a semiconductor memory showing a preferred embodiment of the present invention.
Figure 2:
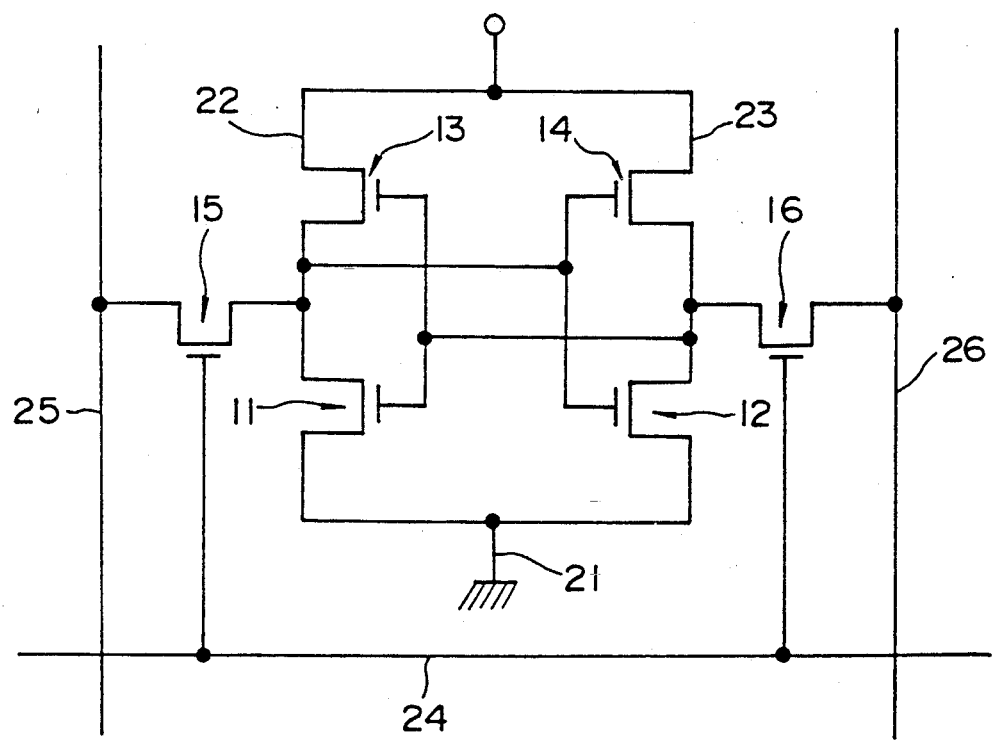
FIG. 2 is a circuit diagram of an equivalent circuit of a complete CMOS type SRAM to which the present invention can be applied.

Referring to FIG. 1, there is shown a semiconductor memory to which the present invention is applied. The semiconductor memory is constructed as such a layer-built CMOS type SRAM as shown in FIG. 2. Thus, referring also to FIG. 2, the layer-built CMOS type SRAM includes a large number of memory cells. Each of such memory cells includes n+ diffused layers 35a to 35g formed in a Si substrate and making source/drain regions of N-channel MOS transistors 11, 12, 15 and 16. Gate electrodes of the N-channel MOS transistors 11 and 12 and a word line 24 are formed from polycrystal Si films 36 to 38 in a first layer on the Si substrate.

The polycrystal Si film 36 is held in flush contact with the n+ diffused layers 35d and 35f by way of contact holes 36a and 36b, respectively, while the polycrystal Si film 37 is held in flush contact with the n+ diffused layer 35b by way of a contact hole 37a.

A grounding line 21 is formed from a polycrystal Si film 41 in a second layer, and the polycrystal Si film 41 is connected to the n+ diffused layers 35a and 35c by way of contact holes 41a and 41b, respectively.

A polycrystal Si film 42 in the second layer same as the polycrystal Si film 41 extends from a location on the n+ diffused layer 35e to another location on the polycrystal Si film 38 while another polycrystal Si film 43 extends from a location on the n+ diffused layer 35g to another location on a polycrystal diffused layer 44 which is a word line for an adjacent memory cell.

The polycrystal Si films 42 and 43 are connected to the n+ diffused layers 35e and 35g by way of contact holes 42a and 43a, respectively.

Gate electrodes of P-channel MOS transistors 13 and 14 are formed from polycrystal Si films 31 and 32 in a third layer, and the polycrystal Si films 31 and 32 are connected to polycrystal Si films 36 and 37 by way of contact holes 31a and 32a, respectively.

Active regions of the P-channel MOS transistors 13 and 14 and power source lines 22 and 23 are formed from polycrystal Si films 33 and 34 in a fourth layer, and drain regions of the P-channel MOS transistors 13 and 14 of the polycrystal Si films 33 and 34 are connected to the polycrystal Si films 32 and 31 by way of contact holes 33a and 34a, respectively.

Accordingly, an overlapping portion of the polycrystal Si film 33 with the polycrystal Si film 31 forms a channel region of the P-channel MOS transistor 13 while an overlapping portion of the polycrystal Si film 34 with the polycrystal Si film 32 forms a channel region of the P-channel MOS transistor 14.

Bit lines 25 and 26 are formed from Al films (not shown) in an upper layer on the polycrystal Si films 33 and 34, and the Al films are connected to the polycrystal Si films 42 and 43 by way of contact holes 25a and 26a, respectively.

Figure 3:
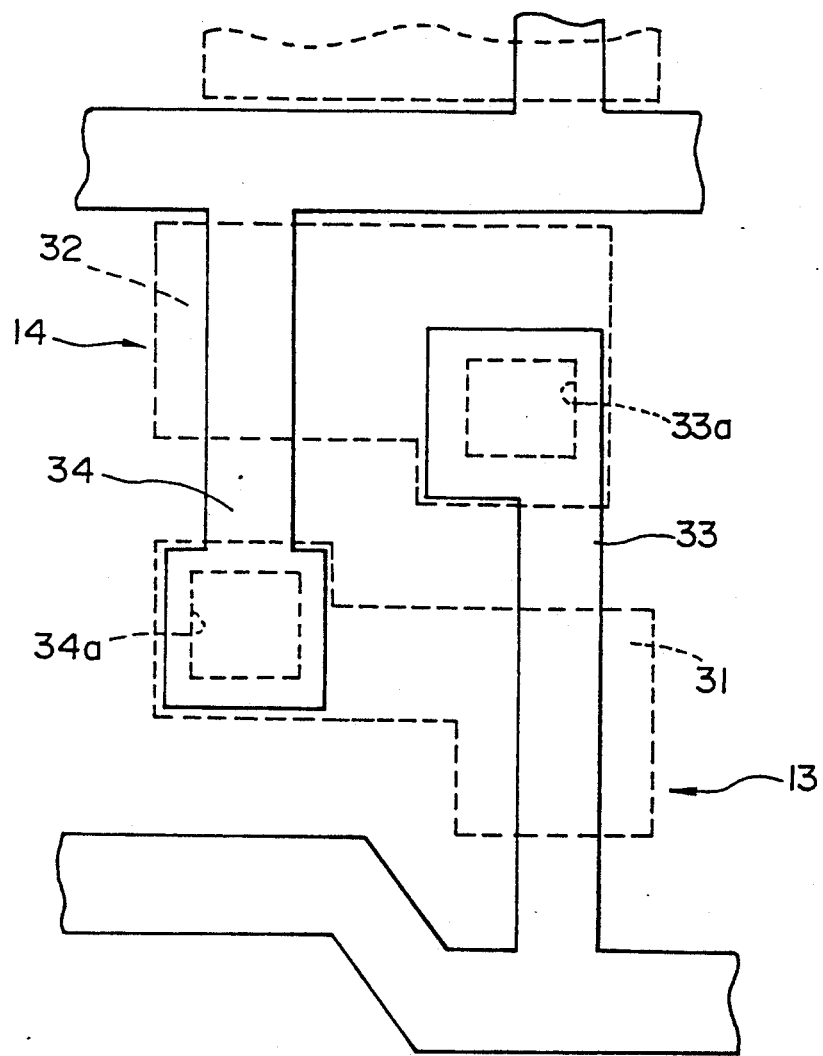
FIG. 3 is a partial plan view of an exemplary one of conventional semiconductor memories.

In the complete CMOS type SRAM of the present embodiment having such construction as described above, each of the channel regions of the P-channel MOS transistors 13 and 14 has a bent portion as apparently seen from FIG. 1. Consequently, even where the area of the memory cell is equal to that of the arrangement shown FIG. 3, the channel length of the P-channel MOS transistors 13 and 14 can be made longer than that of the arrangement of FIG. 3. Particularly, while the memory cell area in the present embodiment is 3.4 $\mu m \times 5.525$ $\mu m$, the channel length of 2.3 $\mu m$ can be assured.

Having now fully described the invention, it will be apparent to one of ordinary skill in the art that many changes and modifications can be made thereto without departing from the spirit and scope of the invention as set forth herein.

What is claimed is:

1. A semiconductor memory comprising a memory cell including a flip-flop in which a thin film transistor is employed as a load element, said thin film transistor having a channel region which is bent at a bend located at an intermediate portion thereof, whereby said channel region is divided into first and second legs on respective sides of said bend, said legs both extending in a single plane away from said bend in non-parallel directions.

2. A semiconductor memory according to claim 1, wherein said thin film transistor is a p-channel MOS transistor.

3. A semiconductor memory according to claim 1, wherein said semiconductor memory is composed of plural layers of polycrystalline silicon film, said flip-flop comprising at least one transistor having its gate formed as a first of said layers, a connection to a word line for said semiconductor memory formed as a second of said layers, said thin film transistor having a gate formed as a third of said layers, and said channel region is made of a fourth layer of polycrystalline silicon film.

* * * * *